(12) United States Patent
Nishiyama et al.

(10) Patent No.: US 8,427,032 B2
(45) Date of Patent: Apr. 23, 2013

(54) SURFACE ACOUSTIC WAVE DEVICE

(75) Inventors: Kenji Nishiyama, Nagaokakyo (JP);
Takeshi Nakao, Nagaokakyo (JP);
Michio Kadota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/347,730

(22) Filed: Jan. 11, 2012

(65) Prior Publication Data

US 2012/0104897 A1 May 3, 2012

Related U.S. Application Data

(63) Continuation of application No. PCT/JP2010/061390, filed on Jul. 5, 2010.

(30) Foreign Application Priority Data

Jul. 17, 2009 (JP) .................. 2009-169165

(51) Int. Cl.
*H01L 41/08* (2006.01)

(52) U.S. Cl.
USPC .................. 310/313 A; 310/313 R (58) Field of Classification Search .............. 310/313 A, 310/313 R
See application file for complete search history.

(56) References Cited

U.S. PATENT DOCUMENTS

| | | | |
|---|---|---|---|
| 5,854,527 A | 12/1998 | Shimizu et al. | |
| 7,471,171 B2 * | 12/2008 | Miura et al. | 333/193 |
| 7,564,174 B2 * | 7/2009 | Matsuda et al. | 310/346 |
| 7,573,178 B2 * | 8/2009 | Inoue et al. | 310/313 R |
| 7,772,742 B2 * | 8/2010 | Kando | 310/313 A |
| 7,863,801 B2 * | 1/2011 | Kadota | 310/313 A |
| 2006/0290233 A1 | 12/2006 | Nishiyama et al. | |
| 2009/0236935 A1 * | 9/2009 | Kando | 310/313 R |
| 2010/0187947 A1 * | 7/2010 | Mimura | 310/313 A |

FOREIGN PATENT DOCUMENTS

| | | |
|---|---|---|
| EP | 0 726 649 A1 | 8/1996 |
| JP | 07-254835 A | 10/1995 |
| JP | 08-222990 A | 8/1996 |
| JP | 09-331229 A | 12/1997 |
| JP | 11-220378 A | 8/1999 |
| WO | 2005/083881 A1 | 9/2005 |

OTHER PUBLICATIONS

Official Communication issued in International Patent Application No. PCT/JP2010/061390, mailed on Oct. 5, 2010.

* cited by examiner

*Primary Examiner* — Mark Budd
(74) *Attorney, Agent, or Firm* — Keating & Bennett, LLP (57) ABSTRACT

A surface acoustic wave device prevents a decrease in yield and a decrease in reliability, such as an impulse withstand voltage, and achieves good frequency characteristics, even when using higher frequencies. The surface acoustic wave device includes an IDT electrode disposed on a piezoelectric substrate, and a first insulating film and at least one second insulating film disposed on the IDT electrode, and utilizes a higher-order mode of an SH wave, in which the acoustic velocity of a surface acoustic wave in the first insulating film located closer to the IDT electrode than the insulating film at an outermost surface is higher than the acoustic velocity of a surface acoustic wave in the second insulating film located at the outermost surface.

6 Claims, 8 Drawing Sheets

SURFACE ACOUSTIC WAVE DEVICE

BACKGROUND OF THE INVENTION

1. Field of the Invention

The present invention relates to a surface acoustic wave device used for a resonator, a filter, or other component, and more particularly, the present invention relates to a surface acoustic wave device in which a plurality of insulating films are stacked on an IDT electrode.

2. Description of the Related Art

Hitherto, surface acoustic wave devices have been widely used for resonators, band filters, and the like.

Figure 14:
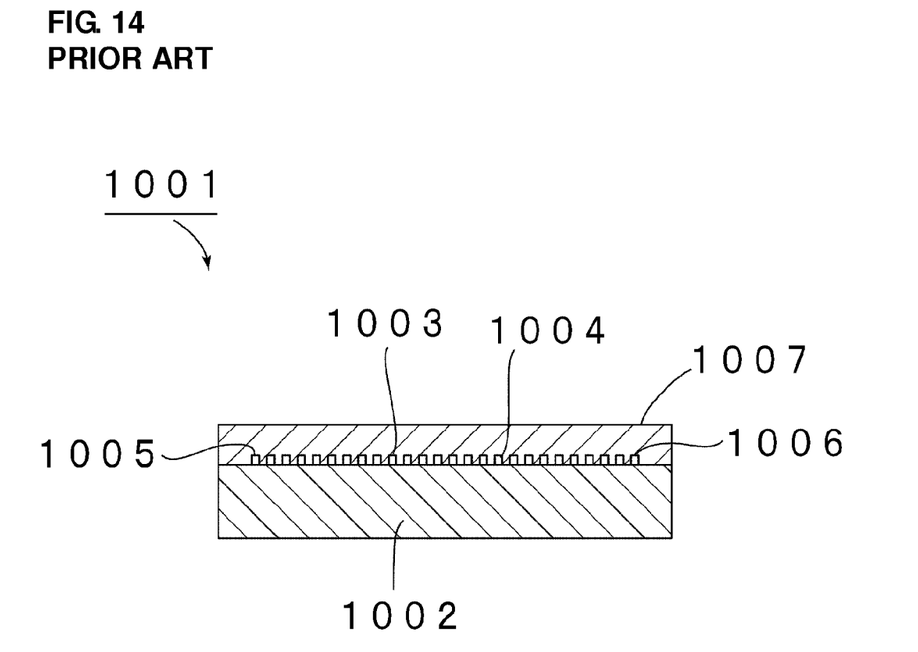
FIG. 14 is a cross-sectional front view for illustrating a conventional surface acoustic wave device.

For example, Japanese Unexamined Patent Application Publication No. 7-254835 described below discloses a surface acoustic wave resonator filter shown in FIG. 14. A surface acoustic wave resonator filter 1001 includes an X-cut LiTaO$_3$ substrate 1002. An electrode structure including IDT electrodes 1003 and 1004 and reflectors 1005 and 1006 is disposed on the X-cut LiTaO$_3$ substrate 1002. A SiO$_2$ film 1007 is disposed so as to cover the electrode structure.

In this device, a response of the fundamental mode of a surface acoustic wave is used and the thickness H of the SiO$_2$ film 1007 is set in the range represented by the formula: 5%<H/λ<15%, where λ is the wavelength of a surface acoustic wave. It is described that, thereby, the frequency-temperature characteristic can be improved, and the electromechanical coupling coefficient can be increased.

In recent years, electronic devices utilizing higher frequencies have been increasingly used. In the surface acoustic wave resonator filter 1001, in order to allow higher frequencies to be used, it is necessary to narrow the electrode finger pitch of the IDT electrodes 1003 and 1004. However, narrowing of the electrode finger pitch may result in difficulty in processing the IDTs 1003 and 1004, and the yield may be decreased. Furthermore, there is also a problem that the impulse withstand voltage may be decreased, resulting in decreased reliability.

SUMMARY OF THE INVENTION

In view of the above-described problems with the conventional technique, preferred embodiments of the present invention provide a surface acoustic wave device in which, even when using higher frequencies, the yield can be increased and reliability, such as an impulse withstand voltage, is prevented from being degraded.

According to a preferred embodiment of the present invention, a surface acoustic wave device includes a piezoelectric substrate, an IDT electrode disposed on the piezoelectric substrate, a first insulating film disposed so as to cover the upper surface of the IDT electrode on the piezoelectric substrate, and at least one second insulating film disposed on the first insulating film; wherein the surface acoustic wave device utilizes a higher-order mode of an SH wave; and an acoustic velocity of a surface acoustic wave in at least one insulating film located closer to the IDT electrode than an insulating film located at an outermost surface among the at least one second insulating film is set to be higher than the acoustic velocity of a surface acoustic wave propagating in the insulating film located at the outermost surface among the at least one second insulating film.

In a preferred embodiment of the surface acoustic wave device according to the present invention, the second insulating film located at the outermost surface preferably is made of silicon oxide, the thickness thereof is about 45% to about 85%, for example, of the wavelength of the surface acoustic wave, the insulating film or films other than the insulating film located at the outermost surface preferably are made of one insulating material selected from the group consisting of silicon nitride, aluminum oxide, and silicon carbide, and the thickness thereof is about 5% to about 21%, for example, of the wavelength of the surface acoustic wave. In this case, a decrease in yield and a decrease in reliability do not easily occur. Furthermore, a response of the higher-order mode of an SH wave utilized can be further increased, and the fundamental mode, which is spurious, can be more effectively suppressed.

In another preferred embodiment of the surface acoustic wave device according to the present invention, the at least one second insulating film includes one second insulating film, the second insulating film is preferably made of silicon oxide, and the first insulating film preferably is made of one insulating material selected from the group consisting of silicon nitride, aluminum oxide, and silicon carbide. In this case, since the device includes only one second insulating film, the insulating film stacked structure can be simplified.

In another preferred embodiment of the surface acoustic wave device according to the present invention, the piezoelectric substrate preferably is made of a LiNbO$_3$ substrate, and the Euler angles of the LiNbO$_3$ substrate are in the range of (0°, 62° to 165°, 0°). In this case, the electromechanical coupling coefficient of the higher-order mode can be further increased, and the response of the fundamental mode can be further decreased. More preferably, the Euler angles of the LiNbO$_3$ substrate are preferably in the range of (0°, 99° to 164°, 0°), and in such a case, the Q factor of the higher-order mode can be further increased.

In the surface acoustic wave device according to various preferred embodiments of the present invention, since the higher-order mode of an SH wave is utilized, higher frequencies can be used compared with the case where the fundamental mode is utilized. Moreover, since the acoustic velocity of a surface acoustic wave in the insulating film located closer to the IDT electrode than an insulating film located at the outermost surface among the at least one second insulating film preferably is set to be higher than the acoustic velocity of a surface acoustic wave propagating in the insulating film located at the outermost surface among the at least one second insulating film, the magnitude of the response of the higher-order mode can be increased to a sufficient level, and the response of the fundamental mode, which is spurious, can be suppressed.

Consequently, higher frequencies can be used without particularly narrowing the electrode finger pitch of the IDT electrode, and also it is possible to obtain good characteristics due to the higher-order mode. Therefore, even when higher frequencies are used, a decrease in yield and a decrease in reliability do not easily occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments of the present invention with reference to the drawings.

Figure 1A:
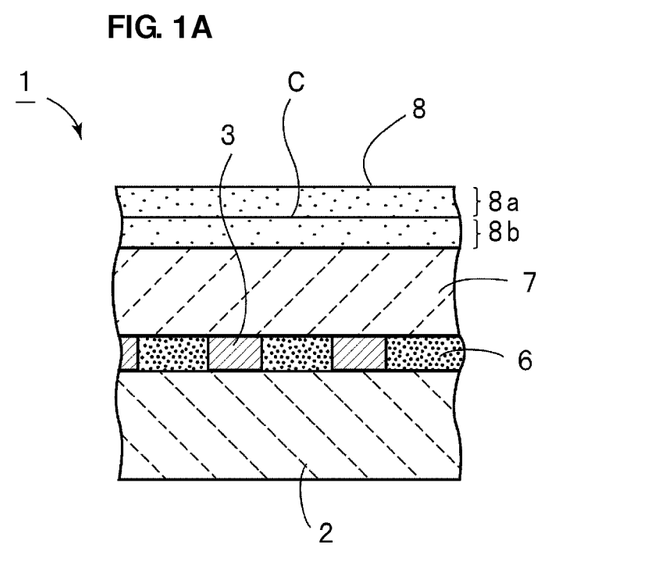
FIGS. 1A and 1B are a schematic partial cross-sectional front view and plan view, respectively, showing a substantial portion of a surface acoustic wave device according to a preferred embodiment of the present invention.
Figure 1B:
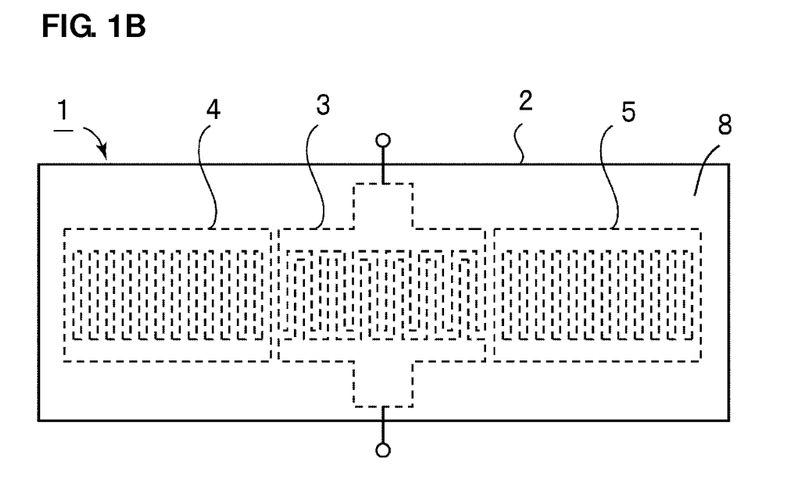

FIGS. 1A and 1B are a schematic partial cross-sectional front view and plan view, respectively, showing a surface acoustic wave device according to a preferred embodiment of the present invention.

A surface acoustic wave device 1 includes a piezoelectric substrate 2. In this preferred embodiment, the piezoelectric substrate 2 preferably is a $LiNbO_3$ substrate, for example.

An IDT electrode 3 and reflectors 4 and 5 are disposed on the piezoelectric substrate 2. The reflectors 4 and 5 are arranged on both sides of the IDT electrode 3 in the propagation direction of a surface acoustic wave to constitute a one-port-type surface acoustic wave resonator.

A silicon oxide film 6 having the same thickness as that of the IDT electrode 3 is disposed so as to fill the spaces between electrode fingers of the IDT electrode 3. Similarly, the silicon oxide film 6 is disposed so as to fill the spaces between electrode fingers of the reflectors 4 and 5, with the same thickness as that of the reflectors 4 and 5.

Furthermore, a first insulating film 7 made of a silicon nitride film is disposed so as to cover the upper surface of the IDT electrode 3. A second insulating film 8 preferably made of silicon oxide is disposed on the first insulating film 7.

The surface acoustic wave device 1 according to this preferred embodiment utilizes the response of the higher-order mode of an SH wave. Accordingly, when compared with the case where the response of the fundamental mode is utilized, since the acoustic velocity of the higher-order mode is higher than that of the fundamental mode, use of higher frequencies can be promoted. In other words, higher frequencies are allowed to be used without particularly narrowing the electrode finger pitch of the IDT electrode 3. Consequently, even in the case where use of higher frequencies is promoted, it is not necessary to particularly increase the accuracy of electrode processing, thus enabling an increase in yield. Furthermore, since the impulse withstand voltage is not easily decreased, reliability is not easily decreased.

In addition, in the surface acoustic wave device 1 according to this preferred embodiment, the acoustic velocity of a surface acoustic wave in the first insulating film 7 located on the IDT electrode 3 side is set higher than the acoustic velocity of a surface acoustic wave in the second insulating film 8 located at the outermost surface. Therefore, as will be described later, the magnitude of the response of the higher-order mode can be increased to a sufficient level, and the response of the fundamental mode, which is spurious, can be suppressed. Consequently, good resonance characteristics using the higher-order mode can be obtained. This will be described more specifically below.

Figure 3:
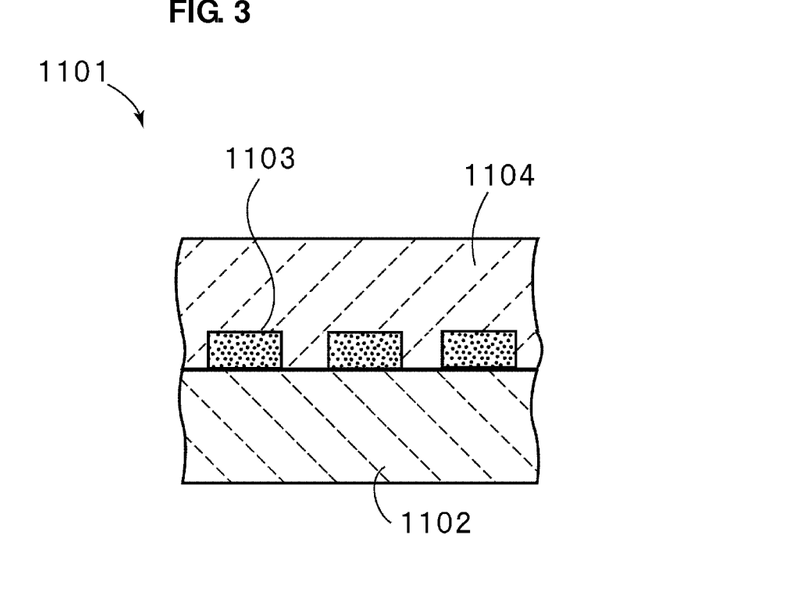
FIG. 3 is a schematic partial cross-sectional front view for illustrating a common structure of a conventional surface acoustic wave device prepared for comparison.
Figure 4:
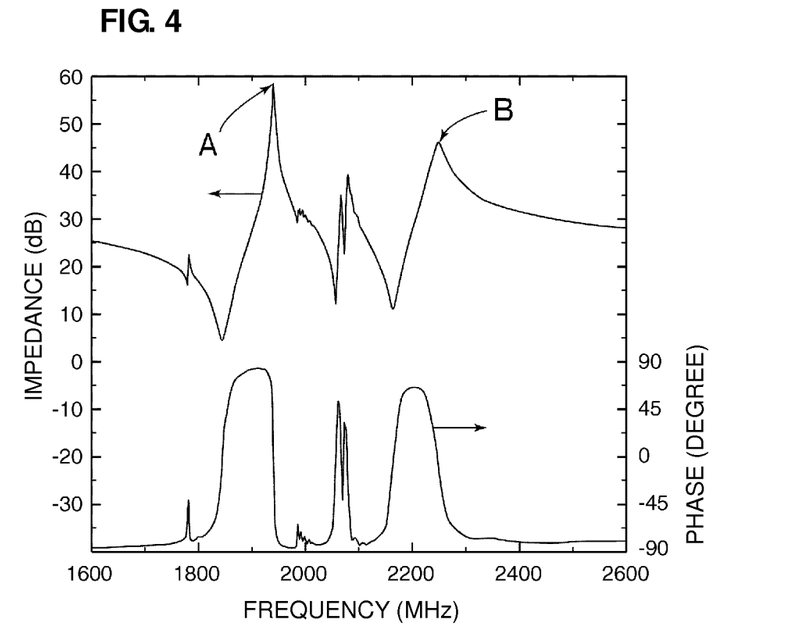
FIG. 4 is a graph showing the impedance characteristics and the phase characteristics of a conventional common surface acoustic wave resonator.

FIG. 3 is a schematic partial cross-sectional front view showing a substantial portion of a conventional common surface acoustic wave device. In a surface acoustic wave device 1101, an IDT electrode 1103 is disposed on a piezoelectric substrate 1102, and a silicon oxide film 1104 is disposed so as to cover the IDT electrode 1103. FIG. 4 shows an example of the impedance characteristics and the phase characteristics of the surface acoustic wave device 1101 having such a stacked structure of piezoelectric substrate/IDT electrode/silicon oxide film.

Figure 5:
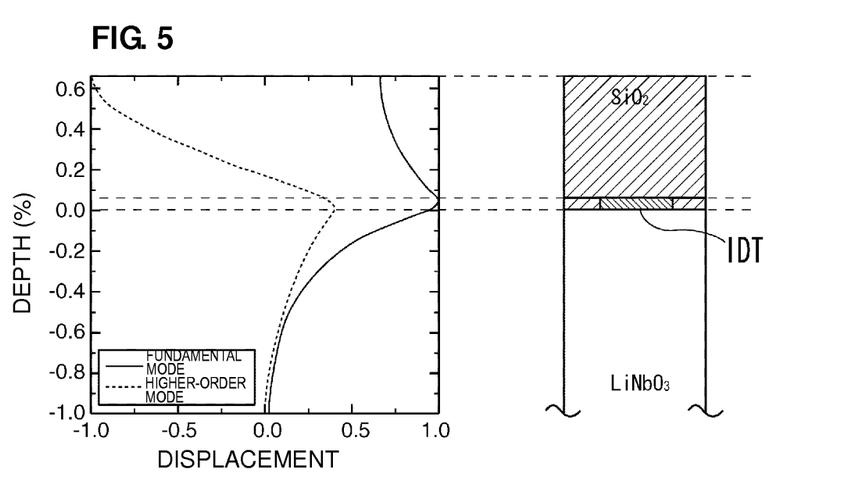
FIG. 5 is a schematic diagram showing a distribution of energy displacement in the fundamental mode and the higher-order mode in a conventional common surface acoustic wave device.

FIG. 5 is a schematic diagram showing a distribution of displacement in the fundamental mode and the higher-order mode in the conventional common surface acoustic wave device 1101 shown in FIG. 3. As is clear from FIG. 5, in the fundamental mode, the displacement is highest at the portion in which the IDT electrode 1103 is disposed. In contrast, the displacement in the higher-order mode is highest at the outermost surface of the silicon oxide film 1104 in which the displacement is in the vicinity of −1.0.

This higher-order mode corresponds to a Sezawa wave, which is higher order mode of a Rayleigh wave. However, the higher-order mode used in the present preferred embodiment preferably is an SH wave (transversal wave having a displacement in a direction parallel to the plane of the substrate), and the wave mode thereof is different from that of a Sezawa wave formed of a combination of a P wave (longitudinal wave having a displacement in the wave propagation direction) and an SV wave (transversal wave having a displacement in the substrate depth direction).

As is clear from FIG. 4, in the surface acoustic wave device 1101, in addition to a response of the fundamental mode indicated by the arrow A, a response of the higher-order mode indicated by the arrow B appears. However, in comparison with the response A of the fundamental mode, the response B of the higher-order mode is small, and therefore, it is not possible to obtain good resonance characteristics utilizing the higher-order mode.

In contrast, in the surface acoustic wave device 1 according to this preferred embodiment, the response of the higher-order mode can be increased, and the response of the fundamental mode can be suppressed. This will be described with reference to FIG. 6.

Non-limiting samples of surface acoustic wave devices according to a preferred embodiment were fabricated as described below. As a piezoelectric substrate 2, a Y-X LiNbO$_3$ substrate with a cut angle of −4°, i.e., a LiNbO$_3$ substrate with Euler angles (0°, 86°, 0°) was used, and an IDT electrode 3 and reflectors 4 and 5 were formed of a Cu film. The thickness of the Cu film was set at 5% of the wavelength λ of a surface acoustic wave. The thickness of a SiO$_2$ film serving as a silicon oxide film 6 was set at 5% of the wavelength as in the IDT electrode 3. Furthermore, the thickness of a SiN film serving as a first insulating film 7 was set at 0%, 10%, or 20% of the wavelength λ. The thickness of a SiO$_2$ film serving as a second insulating film 8 was set at 50% of the wavelength λ. The impedance characteristics and the phase characteristics of the thus-obtained three types of surface acoustic wave devices are shown in FIG. 6.

Figure 6:
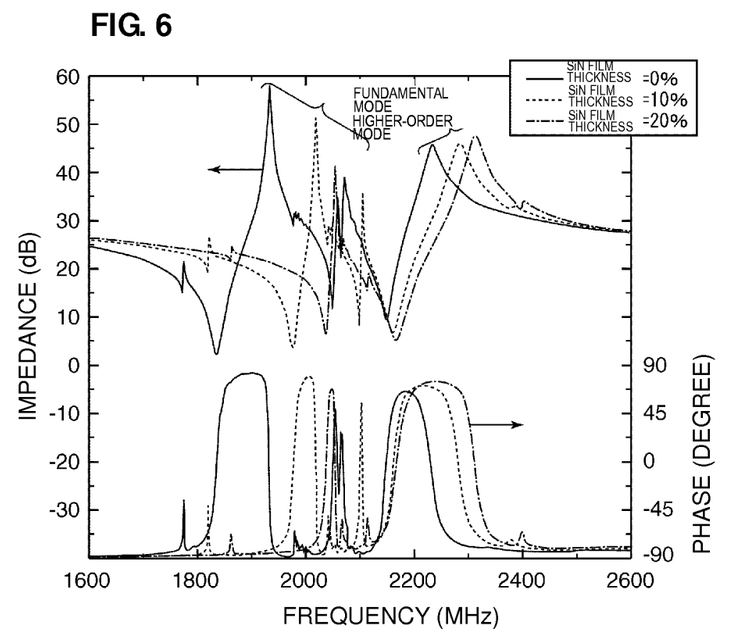
FIG. 6 is a graph showing the impedance characteristics and the phase characteristics of surface acoustic wave resonators in the cases where the thickness of SiN film as a first insulating film is set at 0% (no SiN film is provided), 10%, and 20% of the wavelength λ.

As is clear from FIG. 6, in comparison with the case where the thickness of the SiN film is 0%, i.e., the first insulating film 7 is not present, by increasing the thickness of the SiN film to 10% and to 20%, the response of the fundamental mode can be decreased. In particular, in the case where the thickness of the SiN film is set at 20%, in comparison with the top-to-valley ratio of the response of the fundamental mode, the top-to-valley ratio of the response of the higher-order mode can be increased greatly, and the response of the higher-order mode can be further increased, while the response of the fundamental mode can be considerably decreased.

The reason for this is, by interposing the first insulating film 7 made of a SiN film between the second insulating film 8 made of a SiO$_2$ film and the IDT electrode 3, the higher-order mode in which the acoustic velocity of the surface acoustic wave is higher than the acoustic velocity of the fundamental mode can be excited at a high intensity. That is, since the acoustic velocity of the surface acoustic wave in the first insulating film 7 closer to the IDT electrode 3 side is higher than the acoustic velocity of the surface acoustic wave in the second insulating film 8 located at the outermost surface, the higher-order mode in which the acoustic velocity of the surface acoustic wave is higher than that in the fundamental mode is sufficiently excited, while the excitation of the fundamental mode in which the acoustic velocity of the surface acoustic wave is relatively low is suppressed.

Consequently, as in the preferred embodiment described above, by placing the first insulating film 7, in which the acoustic velocity of the surface acoustic wave is relatively high compared with the second insulating film 8 in which the acoustic velocity of the surface acoustic wave is relatively low, farther inward than the second insulating film 8 located at the outermost surface, the response of the higher-order mode can be increased sufficiently, and the response of the fundamental mode can be suppressed.

Note that, in the present invention, the first insulating film 7 covering the IDT electrode 3 refers to an insulating film covering the upper surface of the IDT electrode 3 as shown in FIG. 1A. Consequently, the silicon oxide film 6 does not correspond to the first insulating film.

Figure 2:
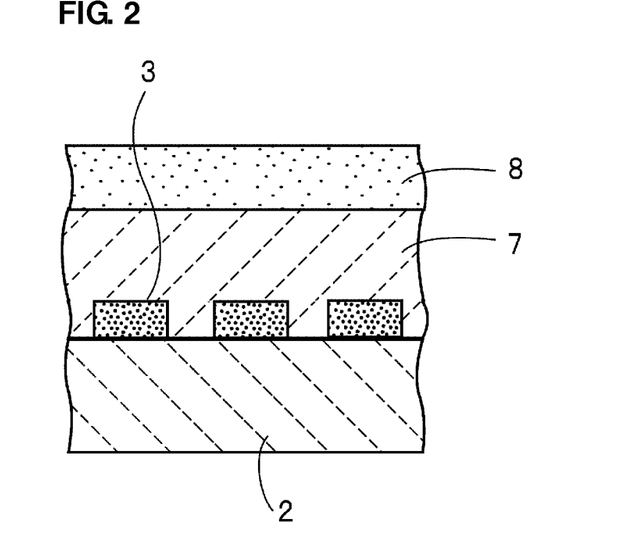
FIG. 2 is a schematic partial cross-sectional front view for illustrating a substantial portion of a surface acoustic wave device according to a modification example of a preferred embodiment of the present invention.

In the structure shown in FIG. 1A, the silicon oxide film 6 is disposed preferably so as to fill the spaces between electrode fingers of the IDT electrode 3. However, as in a modification example shown in FIG. 2, the insulating film 6 may be omitted and the first insulating film 7 may be disposed so as to fill the spaces between electrode fingers. According to the structure shown in FIG. 1A, since the upper surface of the silicon oxide film 6 and the upper surface of the IDT electrode 3 are flush with each other, a first insulating film 7 with a flat upper surface can be easily formed by a deposition method. Furthermore, according to the modification example shown in FIG. 2, a process of forming a silicon oxide film 6 between electrode fingers can be omitted, and thus productivity can be enhanced.

Furthermore, in the preferred embodiment described above, one second insulating film 8 is preferably disposed on the first insulating film 7. However, as indicated by the line C as an imaginary line in FIG. 1A, the second insulating film 8 may have a stacked structure including a plurality of insulating layers 8a and 8b.

That is, assuming that the second insulating film 8 has a structure in which a second insulating film 8a and a second insulating film 8b are stacked, in this case, the acoustic velocity of a surface acoustic wave in an insulating film located closer to the IDT electrode 3 than the second insulating film 8a located at the outermost surface, i.e., at least one of the first insulating film 7 and the second insulating film 8b, has to be higher than the acoustic velocity of the surface acoustic wave in the second insulating film 8a at the outermost surface.

Furthermore, in the preferred embodiment described above, the second insulating film 8 which is the insulating film at the outermost surface is preferably made of silicon oxide, and the first insulating film 7 located inner is preferably made of a silicon nitride film. However, the combination of materials constituting the insulating films is not limited thereto. For example, the insulating film located at the outermost surface may be made not only of silicon oxide, but of silicon nitride, aluminum oxide, or silicon carbide.

Furthermore, the at least one insulating film located inner than the insulating film 8 at the outermost surface can be made of an appropriate insulating material, such as silicon nitride, aluminum oxide, or silicon carbide, as long as the acoustic velocity of the surface acoustic wave is higher than that of the insulating film at the outermost surface.

Preferably, the insulating film 8 at the outermost surface is made of silicon oxide as in the preferred embodiment described above, and the first insulating film 7 located on the IDT electrode 3 side is made of one insulating material selected from the group consisting of silicon nitride, aluminum oxide, and silicon carbide. In this case, the ratio of the acoustic velocity in the first insulating film 7 to the acoustic velocity in the second insulating film 8 is preferably set at about 1.1 to about 1.5, for example, which is sufficiently high. Consequently, the higher-order mode can be effectively excited, and the fundamental mode can be suppressed. Furthermore, it is possible to prevent leakage of the higher-order mode to the side of the second insulating film 8 at the outermost surface.

Furthermore, the piezoelectric substrate 2 is not limited to the LiNbO$_3$ substrate, and a LiTaO$_3$ substrate or quartz substrate can also be used.

In the case where the piezoelectric substrate 2 has a negative temperature coefficient of frequency as in a LiNbO$_3$ substrate or LiTaO$_3$ substrate, preferably, at least one insulating film among the first insulating film 7 and the second insulating film 8 is preferably made of a silicon oxide film having a positive temperature coefficient of frequency. Thereby, it is possible to prevent changes in frequency characteristics due to a change in temperature in the surface acoustic wave device 1. Consequently, the temperature characteristics can be improved.

Furthermore, the electrode material constituting the IDT electrode 3 and the reflectors 4 and 5 is not limited to Cu, and it is possible to use a metal, such as Au, Pt, Ta, or W, or an alloy mainly composed of any of these metals. Furthermore, the IDT electrode 3 and the reflectors 4 and 5 may be made of a stacked metal film in which a plurality of metal films are stacked. Preferably, the IDT electrode 3 has a density that is higher than that of Al, and the density of the IDT electrode 3 preferably is about 1.5 times or more that of the second insulating film 8. Thereby, the coefficient of reflection can be sufficiently increased. If it is less than about 1.5 times, reflection is insufficient, and when a resonator is formed, a large ripple will be caused near the antiresonance point.

Figure 7:
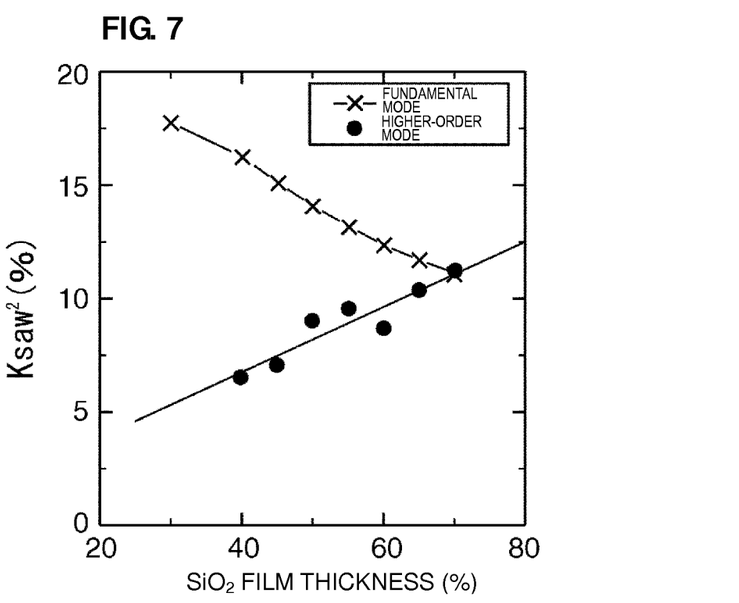
FIG. 7 is a graph showing the relationship between the thickness of a $SiO_2$ film as a second insulating film and the electromechanical coupling coefficient in the fundamental mode and the higher-order mode in a surface acoustic wave device according to a preferred embodiment of the present invention.
Figure 8:
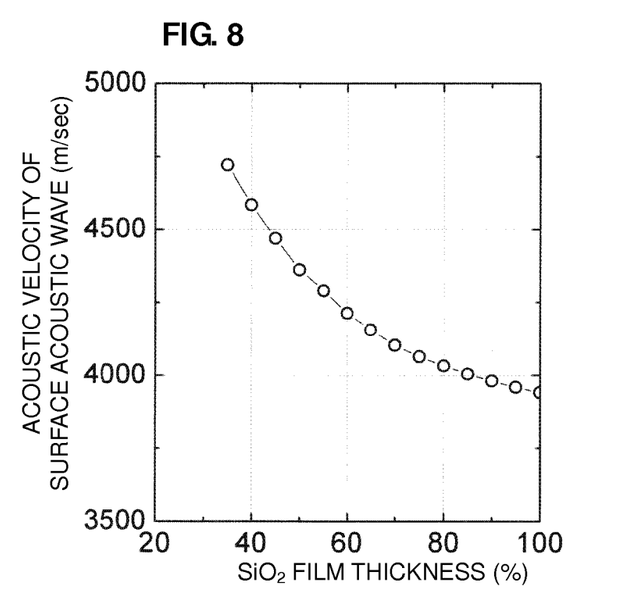
FIG. 8 is a graph showing the relationship between the thickness of a $SiO_2$ film (%) and the acoustic velocity of surface acoustic wave in the higher-order mode.

FIG. 7 is a graph showing the change in the electromechanical coupling coefficient in the fundamental mode and the higher-order mode in the case where the thickness of the $SiO_2$ film serving as the second insulating film 8 is changed in the surface acoustic wave device shown in FIG. 6 in which the thickness of the SiN film is about 20% of the wavelength of the surface acoustic wave. In general, in order to obtain a sufficiently large response, the electromechanical coupling coefficient $Ksaw^2$ is preferably about 7.5% or more, for example. As is clear from FIG. 7, when the thickness of the $SiO_2$ film is preferably set at about 45% or more of the wavelength $\lambda$, the electromechanical coupling coefficient $Ksaw^2$ in the higher-order mode can be about 7.5% or more, for example. Consequently, it is desirable to set the thickness of the $SiO_2$ film at about 45% or more of the wavelength $\lambda$, for example. Furthermore, it is clear that as the thickness of the $SiO_2$ film increases, the electromechanical coupling coefficient $Ksaw^2$ in the fundamental mode decreases. Consequently, the thickness of the $SiO_2$ film is preferable as large as possible as long as it is about 45% or more of the wavelength $\lambda$, for example. However, if the thickness of the $SiO_2$ film becomes too large, the acoustic velocity decreases as shown in FIG. 8, resulting in a possibility that use of higher frequencies may not be promoted. Consequently, in order to utilize the high acoustic velocity which is a key characteristic of the higher-order mode, preferably, the acoustic velocity of the surface acoustic wave in the higher-order mode is about 4,000 m/sec or more, i.e., about 1.1 times or more that of the fundamental wave, for example. Accordingly, the thickness of the $SiO_2$ film is preferably about 85% or less of $\lambda$, for example. Therefore, preferably, the thickness of the $SiO_2$ film preferably is about 45% to about 85% of the wavelength $\lambda$, for example.

Figure 9:
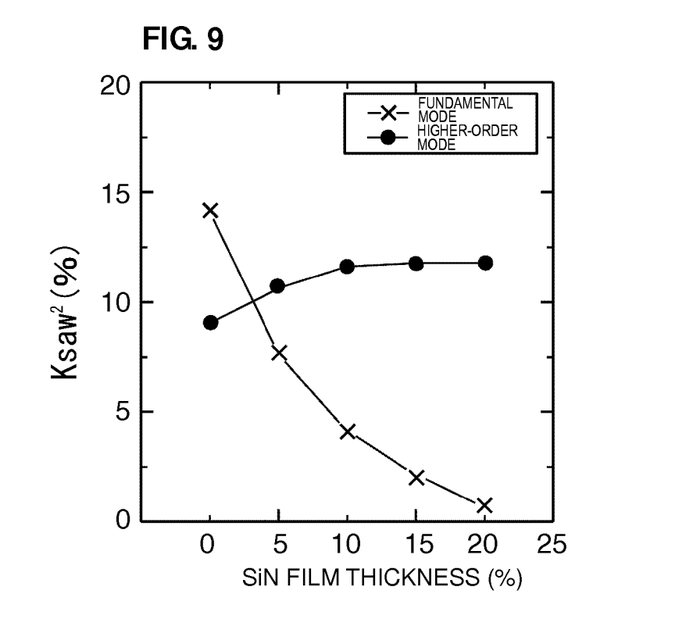
FIG. 9 is a graph showing the relationship between the thickness of a SiN film as a first insulating film and the electromechanical coupling coefficient in the fundamental mode and the higher-order mode in a preferred embodiment of the present invention.

On the other hand, FIG. 9 is a graph showing the change in the electromechanical coupling coefficient in the fundamental mode and the higher-order mode when the thickness of the SiN film is not only changed to approximately 1%, 10%, or 20% shown in FIG. 6, but changed minutely.

As is clear from FIG. 9, when the thickness of the first insulating film 7 made of the SiN film is set at about 5% or more of the wavelength $\lambda$, the electromechanical coupling coefficient $Ksaw^2$ in the fundamental mode can be decreased to about 7.5% or less, for example. Consequently, in order to suppress the response of the fundamental mode, the thickness of the SiN film is preferably set at about 5% or more of the wavelength $\lambda$, for example.

Figure 10:
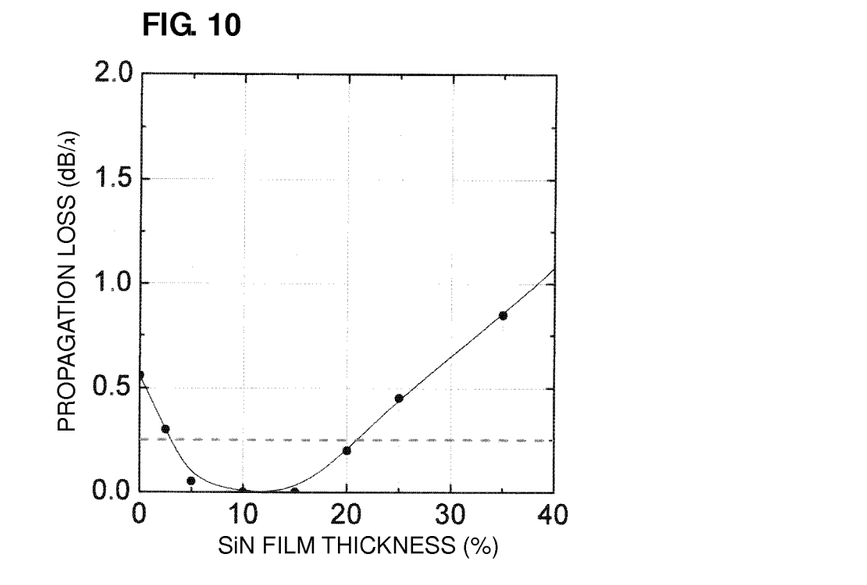
FIG. 10 is a graph showing the relationship between the thickness of a SiN film and the propagation loss in the higher-order mode.

Furthermore, it is clear that in the range in which the thickness of the first insulating film 7 made of the SiN film is about 20% or less of the wavelength $\lambda$, the response of the higher-order mode is about 7.5% or more, for example. Consequently, when the thickness of the first insulating film 7 made of the SiN film is in the range of about 0% to about 20% of the wavelength $\lambda$, the electromechanical coupling coefficient $Ksaw^2$ can be about 7.5% or more, for example. Therefore, the thickness of the SiN film is not particularly limited in setting the magnitude of the response of the higher-order mode to a sufficient level. However, as shown in FIG. 10, when the thickness of the SiN film becomes too large, the leakage component increases. FIG. 10 is a graph showing the relationship between the thickness of the SiN film and the propagation loss in the higher-order mode. In this type of surface acoustic wave device, it is considered to be desirable to set the propagation loss at about 0.25 dB/$\lambda$ or less. Consequently, the thickness of the SiN film is preferably about 21% or less of the wavelength $\lambda$, for example. Therefore, the upper limit of the thickness of the SiN film is preferably about 21% or less, for example.

In surface acoustic wave devices 1 according to various preferred embodiments of the present invention, in the same manner as that in the surface acoustic wave devices in the experiment shown in FIG. 6, except that the thickness of the SiN film as the first insulating film 7 was set at 10% of the wavelength and the thickness of the $SiO_2$ film as the second insulating film 8 was set at 60% and except for the Euler angles of the $LiNbO_3$ substrate, the change in the electromechanical coupling coefficient $Ksaw^2$ in the fundamental mode and the higher-order mode was measured in the case where $\theta$ of the Euler angles of the $LiNbO_3$ substrate was changed. The results thereof are shown in FIG. 11.

Figure 11:
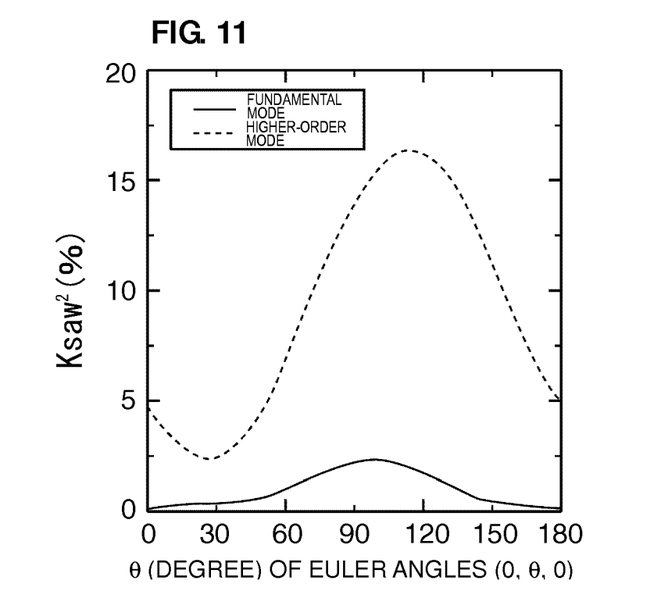
FIG. 11 is a graph showing the relationship between the θ of Euler angles (0°, θ, 0°) of a $LiNbO_3$ substrate and the electromechanical coupling coefficient in the fundamental mode and the higher-order mode in the surface acoustic wave device according to a preferred embodiment of the present invention.

As is clear from FIG. 11, when the $\theta$ of Euler angles (0°, $\theta$, 0°) is in the range of about 62° to about 165°, the electromechanical coupling coefficient $Ksaw^2$ of the higher-order mode can be about 7.5% or more, for example. On the other hand, it is clear that the electromechanical coupling coefficient $Ksaw^2$ of the response of the fundamental mode is low at about 4% or less in this range.

Figure 12:
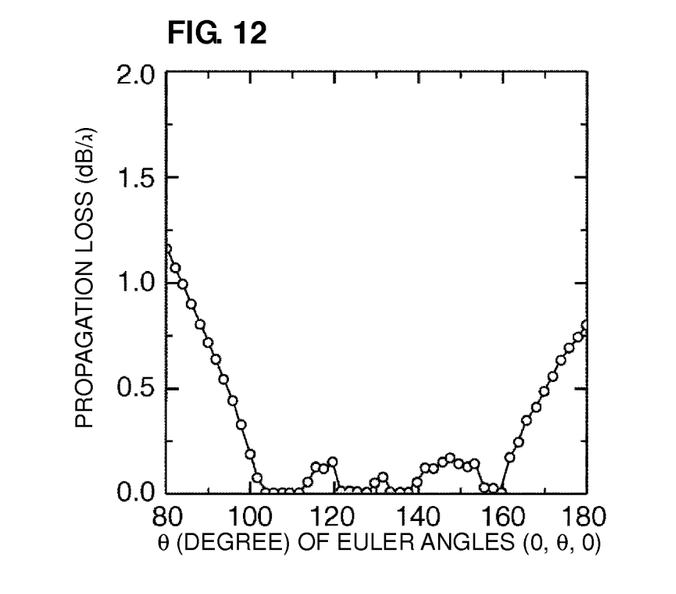
FIG. 12 is a graph showing the relationship between the θ of Euler angles (0°, θ, 0°) of the $LiNbO_3$ substrate and the propagation loss in the higher-order mode in the surface acoustic wave device according to a preferred embodiment of the present invention.

Next, in the same manner as that in the case shown in FIG. 11, the change in the propagation loss in the higher-order mode was measured when the $\theta$ of the Euler angles was changed. The results thereof are shown in FIG. 12.

In this type of surface acoustic wave device, it is preferable to set the propagation loss at about 0.25 dB/$\lambda$ or less, for example. As is clear from FIG. 12, when the $\theta$ of the Euler angles is set in the range of about 99° to about 164°, the propagation loss is about 0.25 dB/$\lambda$ or less, and the propagation loss can be decreased sufficiently. Thereby, the Q factor of the higher-order mode can be further increased.

In order to confirm the results with reference to FIGS. 6 to 12, non-limiting examples of the surface acoustic wave devices 1 as one-port-type surface acoustic wave resonators having the characteristics described below were fabricated, and the impedance characteristics and the phase characteristics were evaluated.

Piezoelectric substrate: Three types of $LiNbO_3$ substrates with Euler angles of (0°, 86°, 0°), (0°, 131°, 0°), or (0°, 155°, 0°) were prepared.

IDT electrode 3: Cu film, with a thickness of 5% of wavelength

First insulating film: SiN film, with a thickness of 10% of wavelength

Second insulating film: $SiO_2$ silicon oxide film, with a thickness of 60% of wavelength The results are shown in FIG. 13.

Figure 13:
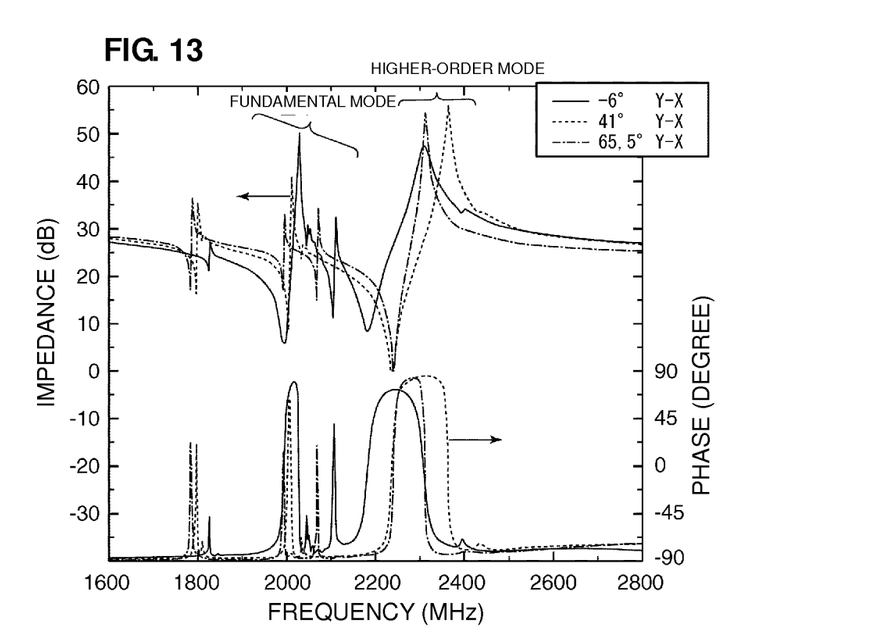
FIG. 13 is a graph showing the impedance characteristics and the phase characteristics of surface acoustic wave devices in the cases where the Euler angles of a $LiNbO_3$ substrate are set at (0°, 86°, 0°), (0°, 131°, 0°), and (0°, 155°, 0°) in a preferred embodiment of the present invention.

As is clear from FIG. 13, it has been confirmed that, in the case where any of the $LiNbO_3$ substrates with $\theta$ of Euler angles of about 86°, about 131°, and about 155° is used, the response of the higher-order mode can be increased sufficiently, while the response of the fundamental mode is suppressed sufficiently, in accordance with various preferred embodiments of the present invention. In particular, in comparison with the case where θ is about 86°, when θ is about 131° or about 155°, the response of the higher-order mode can be further increased, while the response of the fundamental mode can be further decreased. Thereby, the Q factor of the higher-order mode can be increased.

In the preferred embodiments of the present invention described above, a description has been provided of a one-port-type surface acoustic wave resonator. However, the present invention is not limited to the one-port-type surface acoustic wave resonator, but can be applied to various surface acoustic wave devices, such as a longitudinally coupled resonator-type surface acoustic wave filter having a structure in which first and second insulating films are disposed on a piezoelectric substrate. In such a case, use of higher frequencies can be promoted using the higher-order mode, and consequently, it is not necessary to particularly increase the accuracy of electrode formation, thus enabling an increase in yield. Furthermore, reliability, such as such as an impulse withstand voltage, is not easily degraded. In addition, as described above, the response of the higher-order mode can be increased sufficiently, and the response of the fundamental mode can be suppressed. Therefore, good filter characteristics and the like can be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
a piezoelectric substrate;
an IDT electrode disposed on the piezoelectric substrate;
a first insulating film disposed so as to cover an upper surface of the IDT electrode on the piezoelectric substrate; and
at least one second insulating film disposed on the first insulating film; wherein
the piezoelectric substrate, the IDT electrode, the first insulating film, and the at least one second insulating film are arranged and configured to utilize a higher-order mode of an SH wave;
an acoustic velocity of a surface acoustic wave in at least one insulating film located closer to the IDT electrode than an insulating film located at an outermost surface among the at least one second insulating film is higher than the acoustic velocity of a surface acoustic wave propagating in the insulating film located at the outermost surface among the at least one second insulating film; and
the insulating film located at the outermost surface is made of silicon oxide, the thickness thereof is about 45% to about 85% of a wavelength of the surface acoustic wave, the insulating film or films other than the insulating film located at the outermost surface are made of at least one insulating material selected from the group consisting of silicon nitride, aluminum oxide, and silicon carbide, and the thickness thereof is about 5% to about 21% of the wavelength of the surface acoustic wave.

2. A surface acoustic wave device comprising:
a piezoelectric substrate;
an IDT electrode disposed on the piezoelectric substrate;
a first insulating film disposed so as to cover an upper surface of the IDT electrode on the piezoelectric substrate; and
at least one second insulating film disposed on the first insulating film; wherein
the piezoelectric substrate, the IDT electrode, the first insulating film, and the at least one second insulating film are arranged and configured to utilize a higher-order mode of an SH wave;
an acoustic velocity of a surface acoustic wave in at least one insulating film located closer to the IDT electrode than an insulating film located at an outermost surface among the at least one second insulating film is higher than the acoustic velocity of a surface acoustic wave propagating in the insulating film located at the outermost surface among the at least one second insulating film; and
the at least one second insulating film comprises one second insulating film, the second insulating film is made of silicon oxide, and the first insulating film is made of at least one insulating material selected from the group consisting of silicon nitride, aluminum oxide, and silicon carbide.

3. The surface acoustic wave device according to claim 1, wherein the piezoelectric substrate is a $LiNbO_3$ substrate, and Euler angles of the $LiNbO_3$ substrate are (0°, 62° to 165°, 0°).

4. The surface acoustic wave device according to claim 3, wherein the Euler angles of the $LiNbO_3$ substrate are (0°, 99° to 164°, 0°).

5. The surface acoustic wave device according to claim 2, wherein the piezoelectric substrate is a $LiNbO_3$ substrate, and Euler angles of the $LiNbO_3$ substrate are (0°, 62° to 165°, 0°).

6. The surface acoustic wave device according to claim 5, wherein the Euler angles of the $LiNbO_3$ substrate are (0°, 99° to 164°, 0°).

* * * * *